(12) United States Patent
Wheaton

(10) Patent No.: US 11,255,941 B2
(45) Date of Patent: Feb. 22, 2022

(54) APPARATUS AND METHOD USING TIME SHIFTS IN MAGNETIC RESONANCE IMAGING (MRI) TO IMPLEMENT CONTROLLED ALIASING IN PARALLEL IMAGING (CAIPI)

(71) Applicant: CANON MEDICAL SYSTEMS CORPORATION, Otawara (JP)

(72) Inventor: Andrew James Wheaton, Vernon Hills, IL (US)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 0 days.

(21) Appl. No.: 16/851,758

(22) Filed: Apr. 17, 2020

(65) Prior Publication Data
US 2021/0325498 A1 Oct. 21, 2021

(51) Int. Cl.
G01V 3/00 (2006.01)
G01R 33/561 (2006.01)
G01R 33/483 (2006.01)
G01R 33/56 (2006.01)

(52) U.S. Cl.
CPC ...... *G01R 33/5611* (2013.01); *G01R 33/4835* (2013.01); *G01R 33/5608* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | |
|---|---|---|---|
| 7,002,344 B2 | 2/2006 | Griswold et al. | |
| 8,405,395 B2 | 3/2013 | Setsompop et al. | |
| 9,989,610 B2 | 6/2018 | Wang et al. | |
| 2003/0210044 A1* | 11/2003 | Hwang | G01R 33/5613 324/307 |
| 2012/0239329 A1* | 9/2012 | Yang | G01C 19/721 702/72 |
| 2013/0249548 A1* | 9/2013 | Stemmer | G01R 33/44 324/309 |
| 2015/0177353 A1 | 6/2015 | Setsompop et al. | |
| 2015/0301145 A1* | 10/2015 | Kerr | G01R 33/5611 324/309 |

(Continued)

FOREIGN PATENT DOCUMENTS

CN 108957375 A 12/2018
EP 3 413 074 A1 12/2018

OTHER PUBLICATIONS

MRI_Acronyms.pdf @2021 AD Elster, Elster LLC All rights reserved. (Year: 2021).*

(Continued)

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

A method and apparatus are provided to perform controlled aliasing in parallel imaging (CAIPI) using time shifts between the radio frequency (RF) excitation pulses and the waveform of the slice-select gradient field to shift respective sampling points within the two-dimensions of k-space corresponding to phase encoding. Thus, a CAIPI sampling pattern is generated using time shifts, rather than by modulating the RF excitation pulses or gradient fields.

20 Claims, 11 Drawing Sheets

(56) References Cited

U.S. PATENT DOCUMENTS

2018/0164395 A1* 6/2018 Setsompop ........ G01R 33/5613
2019/0120922 A1 4/2019 Wheaton

OTHER PUBLICATIONS

Felix A. Breuer, Martin Blaimer, Robin M. Heidemann, Matthias F. Mueller, Mark A. Griswold, Peter M. Jakob. "Controlled Aliasing in Parallel Imaging Results in Higher Acceleration (CAIPIRINHA) for Multi-Slice Imaging." Magnetic Resonance in Medicine, 53: 684-691 (2005).

Kawin Setsompop, Borjan A. Gagoski, Jonathan R. Polimeni, Thomas Witzel, Van J. Wedeen, Lawrence L. Wald. "Blipped-Controlled Aliasing in Parallel Imaging for Simultaneous Multislice Echo Planar Imaging With Reduced g-Factor Penalty." Magnetic Resonance in Medicine. 67:1210-1224 (2012).

* cited by examiner

Sagital view

Transverse view

FIG. 3H
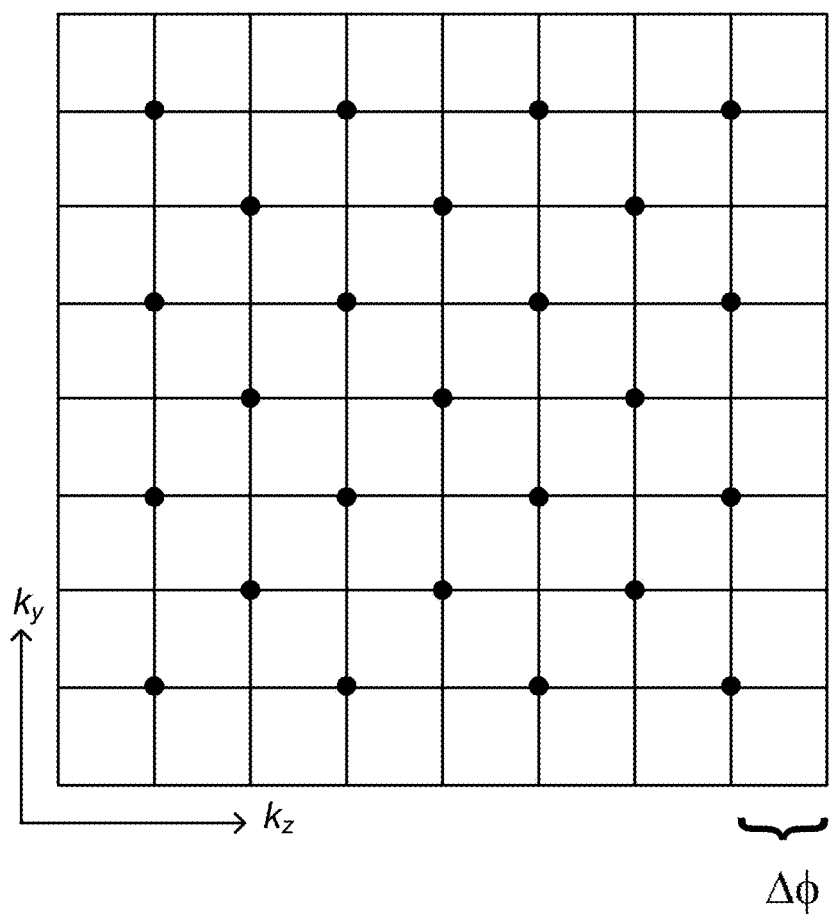
FIG. 3I
Sagital view
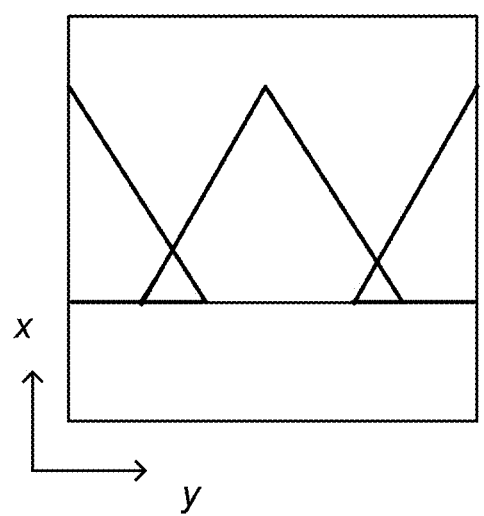
Transverse view
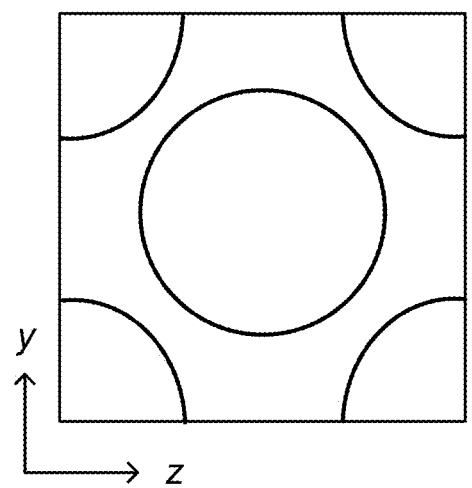

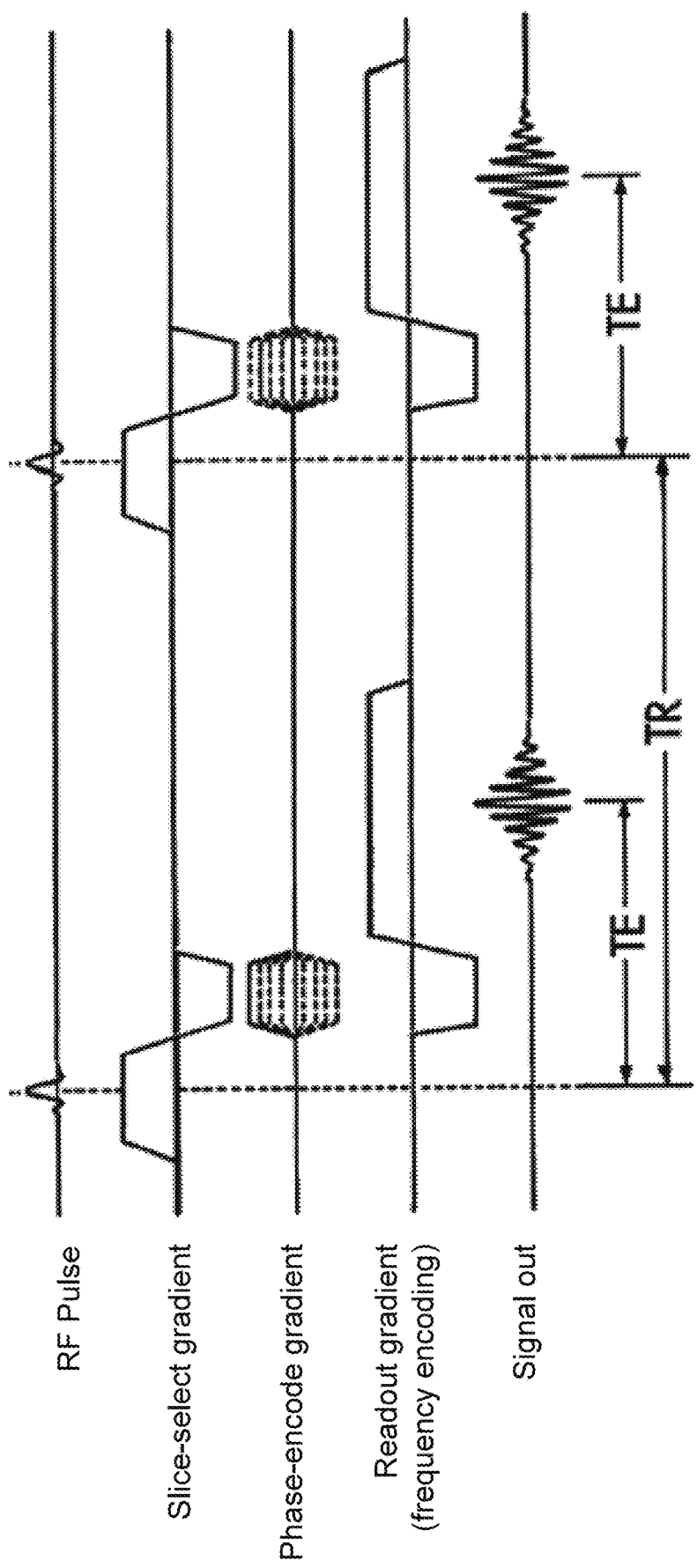

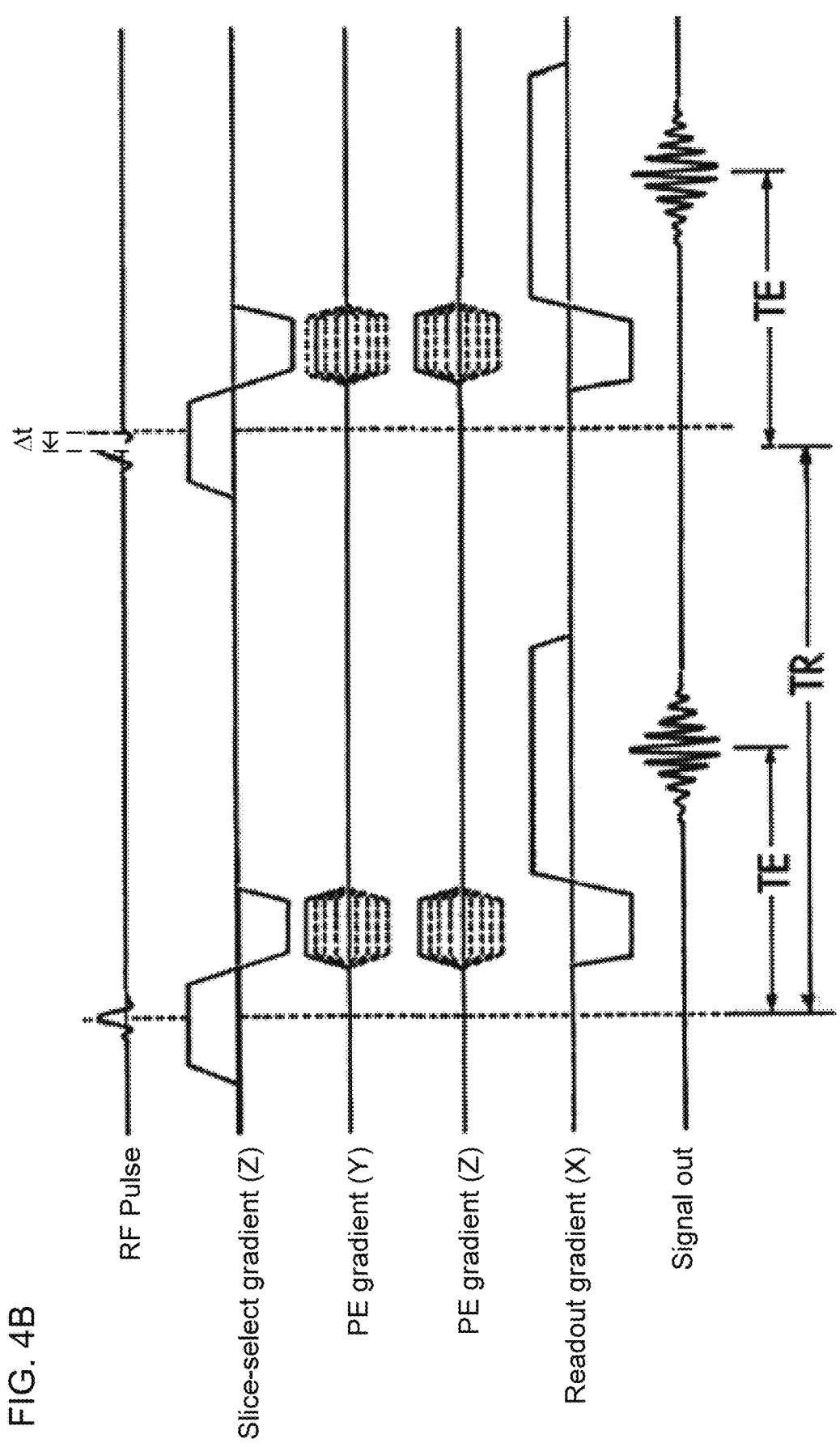

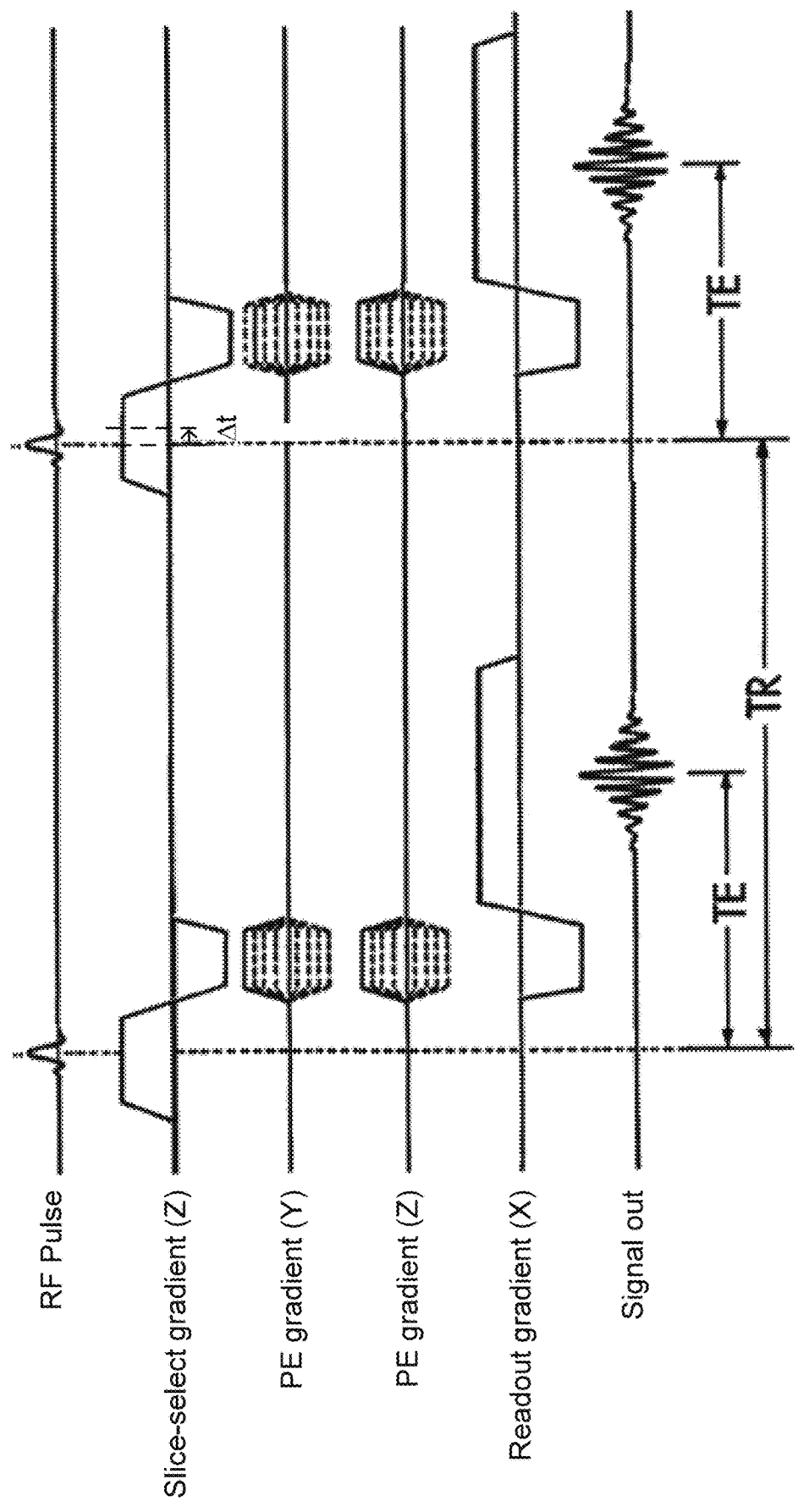

APPARATUS AND METHOD USING TIME SHIFTS IN MAGNETIC RESONANCE IMAGING (MRI) TO IMPLEMENT CONTROLLED ALIASING IN PARALLEL IMAGING (CAIPI)

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Magnetic resonance imaging (MRI) is an imaging scan method that magnetically excites nuclear spins of a subject placed in a magnetostatic field by a radio frequency (RF) pulse having a Larmor frequency thereof, to generate an image from magnetic resonance signal data generated with the excitation.

Accelerated imaging can be achieved using controlled aliasing in parallel imaging (CAIPI) techniques. For example, the number of samples can be reduced by skipping sample points in k-spaces and zero filing. However, skipping sample points in k-spaces can cause aliasing in the spatial domain, which can be difficult to separate. CAIPI techniques can be introduced to stagger the samples in k-space to more easily unalias the accelerated data. Current methods achieve the staggered sampling in k-space either by modulating the RF pulses (e.g., phase modulation) or by modulating the gradient fields (e.g., amplitude modulating the phase-encode gradients).

Other methods use k-space-based methods for the reconstruction of CAIPI acquisitions. These other methods include SENSE, GRAPPA, slice-GRAPPA (SG), and Autocalibrating CAIPI.

Improved methods for moment shifting the samples in k-space are desired. These improved methods for shifting the samples in k-space can improve the simplicity and robustness of CAIPI techniques.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 3H shows a CAIPI sampling pattern that is accelerated by a factor of 2, according to one implementation;

FIG. 3I shows sagittal and transverse views generated when Fourier transforming the MRI data acquired according to the sampling pattern in FIG. 3H, according to one implementation;

FIG. 4A shows a timing sequence of a pulse sequence to generate field echoes without the time shifts used to generate a CAIPI sampling pattern, according to one implementation;

FIG. 4B shows a timing diagram of a pulse sequence with time shifts of the RF pulse to generate a CAIPI sampling pattern, according to one implementation;

FIG. 4C shows a timing diagram of a pulse sequence with time shifts of the $G_{SS}$ gradient waveform to generate the CAIPI sampling pattern, according to one implementation.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more."

Whereas related methods realize the controlled aliasing in parallel imaging (CAIPI) by modulating either the phase of RF excitation pulses or the amplitude of magnetic field gradient waveforms to achieve different sampling patterns in a phase-encode (PE) and slice-encode (SE) directions, the methods described herein advantageously use time delays to achieve the desired k-space sampling patterns without modulating the RF pulses or the gradient waveforms. The CAIPI technique enables accelerated acquisition of magnetic resonance imaging (MRI) data without significantly degrading the image quality by minimizing the residual signal that arises from aliasing.

The methods described herein are not limited to using the SENSE method. Other parallel imaging methods such as GRAPPA or ARC may be used. Nevertheless, the methods a primarily illustrated using the non-limiting example in which the SENSE method is used for reconstruction of separate images for the respective slices.

Figure 1:
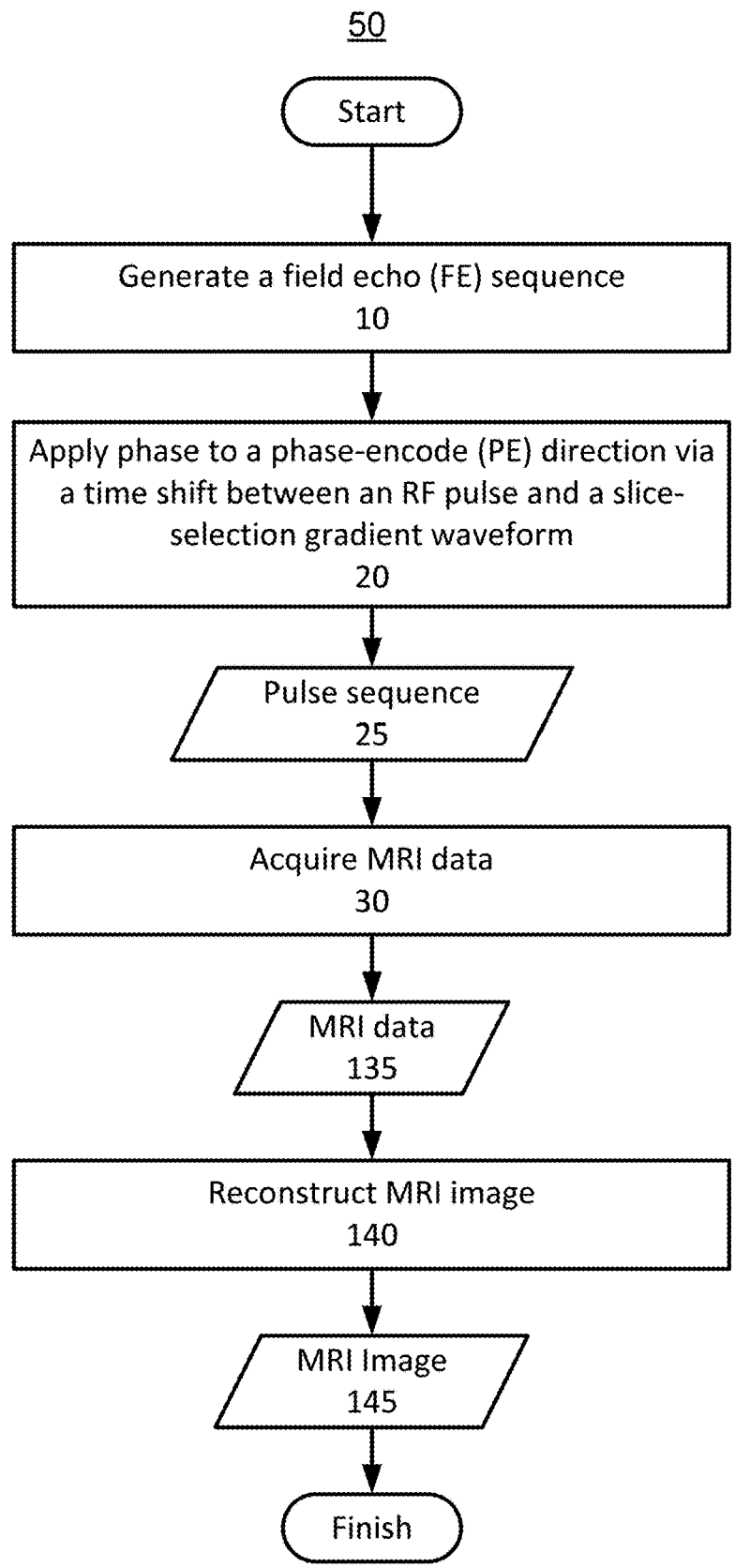
FIG. 1 shows a flow chart of a method for time shifting waveforms in a magnetic resonance imaging (MRI) pulse sequence to generate controlled aliasing in parallel imaging (CAIPI) MRI data and reconstruct MRI images therefrom, according to one implementation.

Referring now to the drawings, wherein like reference numerals designate identical or corresponding parts throughout the several views, FIG. 1 shows a flow diagram of a method 50 for generating CAIPI MRI data using time shifts to adjust the k-space sampling pattern of signal acquired PE and SE directions, and then reconstruct images from the CAIPI MRI data. In steps 10 and 20, a field echo (FE) sequence 25 is generated and modified to sample the two phase-encoding dimensions using a CAIPI sampling pattern with an acceleration factor R. The CAIPI sampling pattern is achieved using relative time shifts between the radio frequency (RF) pulses and the slice-selection (SS) waveforms, as described in more detail below. In step 30, MRI data 35 is acquired using the calculated FE sequence 25. In step 40, an MRI image 45 is reconstructed from the MRI data 35.

Figure 2:
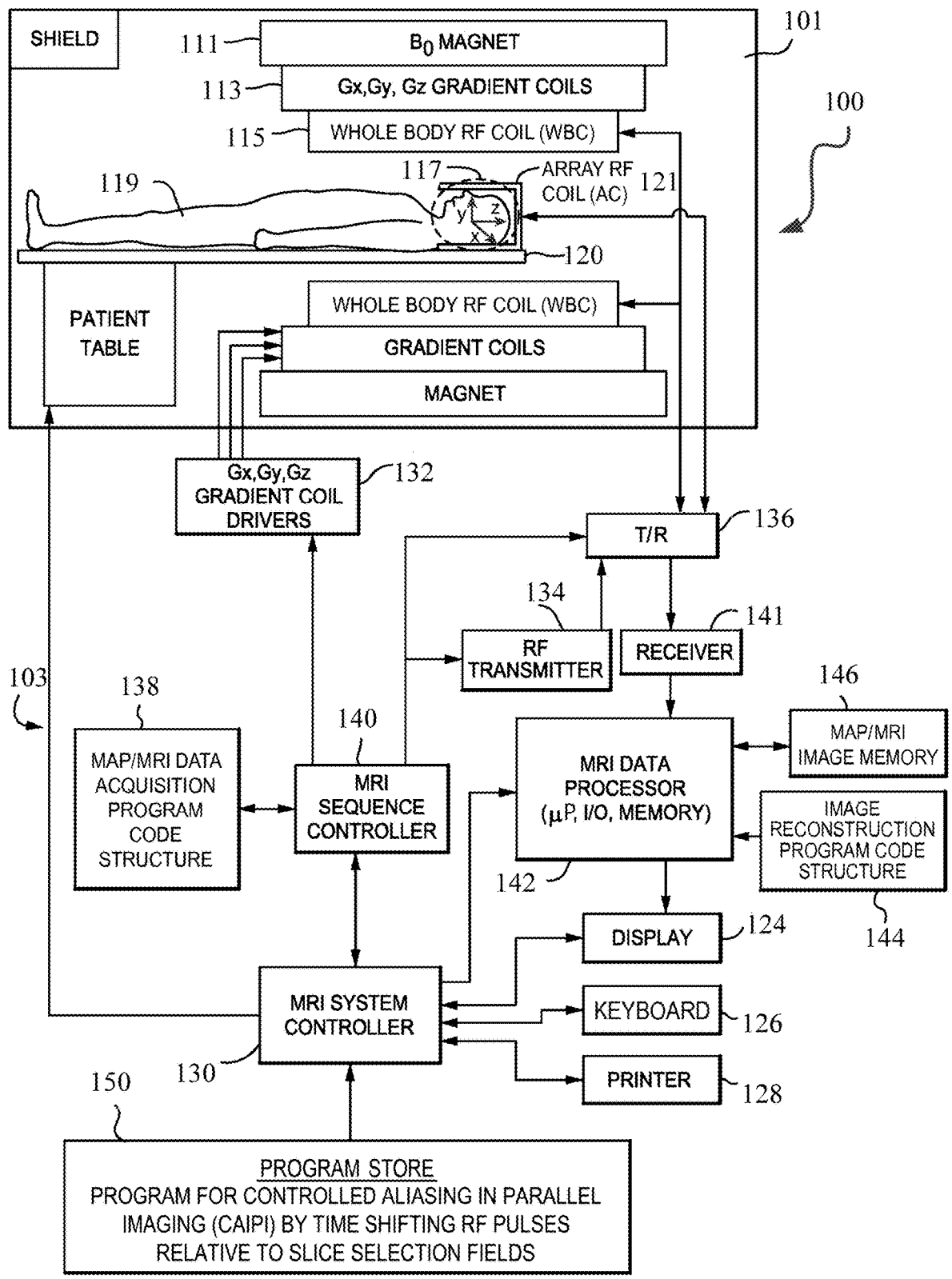
FIG. 2 shows a first example of magnetic resonance imaging (MRI) system, according to one implementation.

FIG. 2 shows a non-limiting example of a magnetic resonance imaging (MRI) system 100. The MRI system 100 depicted in FIG. 2 includes a gantry 101 (shown in a schematic cross-section) and various related system components 103 interfaced therewith. At least the gantry 101 is typically located in a shielded room. The MRI system geometry depicted in FIG. 2 includes a substantially coaxial cylindrical arrangement of the static field $B_0$ magnet 111, a Gx, Gy, and Gz gradient coil set 113, and a large whole-body RF coil (WBC) assembly 115. Along a horizontal axis of this cylindrical array of elements is an imaging volume 117 shown as substantially encompassing the head of a patient 119 supported by a patient table 120.

One or more smaller array RF coils 121 can be more closely coupled to the patient's head (referred to herein, for example, as "scanned object" or "object") in imaging volume 117. As those in the art will appreciate, compared to the WBC (whole-body coil), relatively small coils and/or arrays, such as surface coils or the like, are often customized for particular body parts (e.g., arms, shoulders, elbows, wrists, knees, legs, chest, spine, etc.). Such smaller RF coils are referred to herein as array coils (AC) or phased-array coils (PAC). These can include at least one coil configured to transmit RF signals into the imaging volume, and a plurality of receiver coils configured to receive RF signals from an object, such as the patient's head, in the imaging volume.

The MRI system 100 includes a MRI system controller 130 that has input/output ports connected to a display 124, a keyboard 126, and a printer 128. As will be appreciated, the display 124 can be of the touch-screen variety so that it provides control inputs as well. A mouse or other I/O device(s) can also be provided.

The MRI system controller 130 interfaces with a MRI sequence controller 140, which, in turn, controls the Gx, Gy, and Gz gradient coil drivers 132, as well as the RF transmitter 134, and the transmit/receive switch 136 (if the same RF coil is used for both transmission and reception). The MRI sequence controller 140 includes suitable program code structure 138 for implementing MRI imaging (also known as nuclear magnetic resonance, or NMR, imaging) techniques including parallel imaging. MRI sequence controller 140 can be configured for MR imaging with or without parallel imaging. Moreover, the MRI sequence controller 140 can facilitate one or more preparation scan (pre-scan) sequences, and a scan sequence to obtain a main scan magnetic resonance (MR) image (referred to as a diagnostic image). MR data from pre-scans can be used, for example, to determine sensitivity maps for RF coils 115 and/or 121 (sometimes referred to as coil sensitivity maps or spatial sensitivity maps), and to determine unfolding maps for parallel imaging.

The MRI system components 103 include an RF receiver 141 providing input to data processor 142 so as to create processed image data, which is sent to display 124. The MRI data processor 142 is also configured to access previously generated MR data, images, and/or maps, such as, for example, coil sensitivity maps, parallel image unfolding maps, distortion maps and/or system configuration parameters 146, and MRI image reconstruction program code structures 144 and 150.

In one embodiment, the MRI data processor 142 includes processing circuitry. The processing circuitry can include devices such as an application-specific integrated circuit (ASIC), configurable logic devices (e.g., simple programmable logic devices (SPLDs), complex programmable logic devices (CPLDs), and field programmable gate arrays (FPGAs), and other circuit components that are arranged to perform the functions recited in the present disclosure.

The processor 142 executes one or more sequences of one or more instructions contained in the program code structures 144 and 150. Alternatively, the instructions can be read from another computer-readable medium, such as a hard disk or a removable media drive. One or more processors in a multi-processing arrangement can also be employed to execute the sequences of instructions contained in the program code structures 144 and 150. In alternative embodiments, hard-wired circuitry can be used in place of or in combination with software instructions. Thus, the disclosed embodiments are not limited to any specific combination of hardware circuitry and software. For example, the program code structure 150 can store instructions that when executed perform method 50.

Additionally, the term "computer-readable medium" as used herein refers to any non-transitory medium that participates in providing instructions to the processor 142 for execution. A computer readable medium can take many forms, including, but not limited to, non-volatile media or volatile media. Non-volatile media includes, for example, optical, magnetic disks, and magneto-optical disks, or a removable media drive. Volatile media includes dynamic memory.

Also illustrated in FIG. 2 is a generalized depiction of an MRI system program storage (memory) 150, where stored program code structures such as instructions to perform method 50 are stored in non-transitory computer-readable storage media accessible to the various data processing components of the MRI system 100. As those in the art will appreciate, the program store 150 can be segmented and directly connected, at least in part, to different ones of the system 103 processing computers having most immediate need for such stored program code structures in their normal operation (i.e., rather than being commonly stored and connected directly to the MRI system controller 130).

Additionally, the MRI system 100 as depicted in FIG. 2 can be utilized to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Furthermore, not only does the physical state of the processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes an image reconstruction map (e.g., coil sensitivity map, unfolding map, ghosting map, a distortion map etc.) generation process, an array of computer-readable accessible data value storage sites in physical storage media will be transformed from some prior state to a new state wherein the physical states at the physical sites of such an array vary between minimum and maximum values to represent real world physical events and conditions. As those in the art will appreciate, such arrays of stored data values represent and also constitute a physical structure, as does a particular structure of computer control program codes that, when sequentially loaded into instruction registers and executed by one or more CPUs of the MRI system 100, causes a particular sequence of operational states to occur and be transitioned through within the MRI system 100.

The MRI system 100 configured to perform method 50 has several advantages. First, the complications of modulating the waveforms of the RF pulses or the gradient waveforms can be avoided by shifting in time the RF pulses with respect to the SS magnetic field gradient waveform ($G_{SS}$). For example, a pattern of time-shifts of the $G_{SS}$ gradient can be generated. As a result, even though the time position changes within the sequence, all gradient waveforms and amplitudes can remain the same amplitude and shape throughout the imaging process.

Additionally, using a pulse sequence with a time-shifted $G_{SS}$ gradient can remove the need to modulate the RF pulse or $G_{SS}$ gradient waveform. For example, modulating the RF pulse can lead to complications when the RF pulses are distorted by nonlinearities in downstream electronics (e.g., amplifiers). Further, using a pulse sequence with a time-shifted $G_{SS}$ gradient assists in maintaining gradient amplitude, gradient power, duty cycle, and acoustic noise over time. In other words, by shifting a time-center of the $G_{SS}$ gradient relative to the RF magnetic center rather than adding anything extra to the gradient, the MRI system 100 can be more efficient and prevent running into practical hardware limitations.

Returning to FIG. 1, in step 10 of method 50, an initial field echo (FE) sequence 15 is calculated. For example, FIG. 4A shows an example of one implementation for a FE sequence. In this example, a radio frequency (RF) excitation pulse excited a transverse magnetization for a given slice. That is, the RF pulse excites a flip angle a in the spins of the slice, respectively. A $G_{SS}$ gradient is applied during the same time period as the RF pulses, and the $G_{SS}$ gradient waveform has a flat top with a period that is longer than the RF pulse, such that the RF pulse can be shifted in time and still be within the time duration of the flat-top portion of the $G_{SS}$ gradient waveform for the SS magnetic field. The FE sequence 25 also includes the application of one or more phase-encode gradients and a readout gradient (e.g., frequency-encode gradient). In FIG. 4A, the first RF pulse occurs at the zero time. In certain implementations, this zero time can be defined as the center of the first and second RF pulses. The time between the zero time for the RF pulse and the readout signal is the echo time (TE), and the time between the zero time for the first RF pulse and the zero time for the subsequent RF pulse is the repetition time (TR).

In addition to the non-limiting example shown in FIG. 4A, other field echo (FE) pulse sequences can be used. For example, the FE sequence 15 can include spoiler gradient pulses and/or rewind gradient pulses. The FE sequence 15 can be a steady-state free precession (SSFP), a balanced SSFP sequence, etc., as would be understood by a person of ordinary skill in the art. For example, the pulse sequence can rewind the gradient moment to refocus the magnetization.

In step 20 of method 50, a time shift is applied to the FE sequence 25 to realize a CAIPI technique. For example, a time shift is applied to one of the RF pulses to induce a moment shift in a slice encode ($k_z$) direction. For example, FIG. 4B shows that the second RF pulse is shifted backwards in time by an amount $\Delta t$. FIG. 4C shows that the second $G_{SS}$ gradient waveform is shifted forwards in time by an amount $\Delta t$.

Method 50 shows a non-limiting implementation in which the FE sequence 25 is calculated using two steps by first generating the initial FE sequence 15 without the CAIPI k-space sample offsets, and then modifying the initial FE sequence 15 with time-shifts to cause the CAIPI k-space sample offsets, resulting in the CAIPI FE sequence 25. The methods described herein also include a non-limiting implementation in which the CAIPI FE sequence 25 is directly generated in a single step.

Figure 3A:
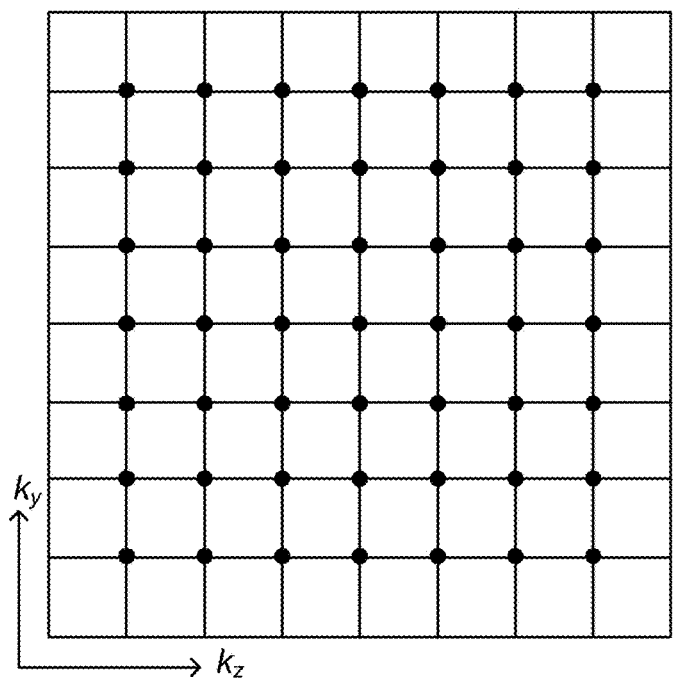
FIG. 3A shows a full sampling pattern is the $k_y$ and $k_y$ PE directions (i.e., no acceleration in either PE directions— $R_y=1$ and $R_z=1$), according to one implementation.
Figure 3B:
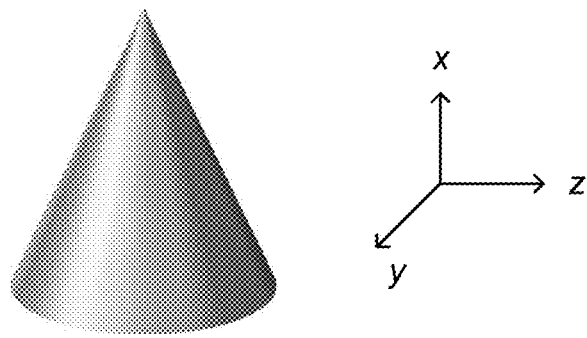
FIG. 3B shows a conic image that is being scanned to generate an MRI image, according to one implementation.
Figure 3C:
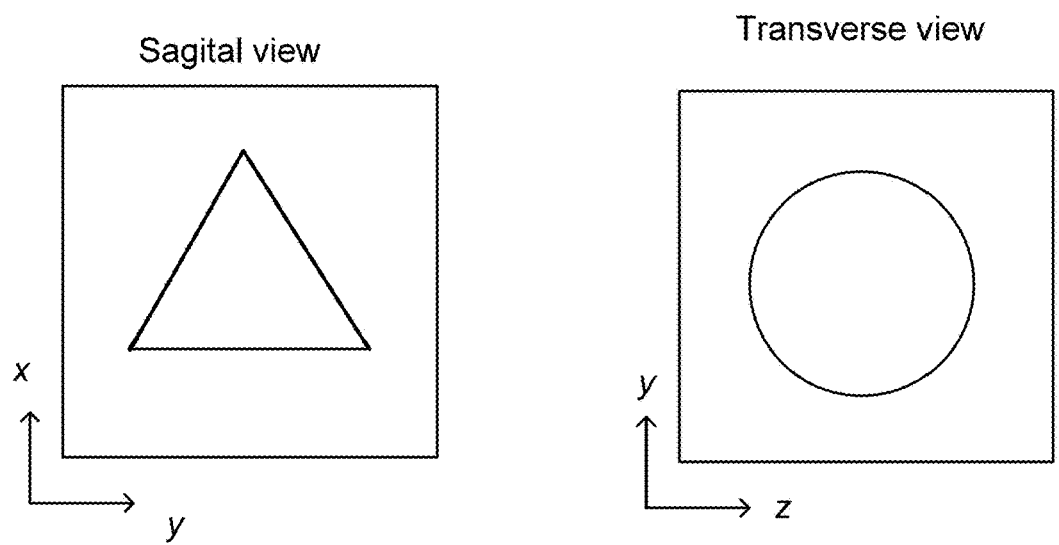
FIG. 3C shows sagittal and transverse views generated when Fourier transforming the MRI data acquired according to the sampling pattern in FIG. 3A, according to one implementation.

For example, the time shift can be selected to induce a k-space sample shift $\Delta k_z$ (e.g., and sample shift of one k-space position is equivalent to $\Delta k_z=1/FOV_z$) in the $k_z$ SE direction, as shown in FIG. 4C. FIGS. 3A-3I illustrate the various effects of different sampling patterns (including CAIPI) in k-space SE. FIG. 3A illustrates sampling every point in k-space without an acceleration factor $R_y$ in the $k_y$ direction or an acceleration factor $R_z$ in the $k_z$ direction. When the conical shape shown in FIG. 3B is imaged using this complete sampling pattern, the sagittal and transverse images shown in FIG. 3C will be generated. That is, there is no aliasing.

Figure 3D:
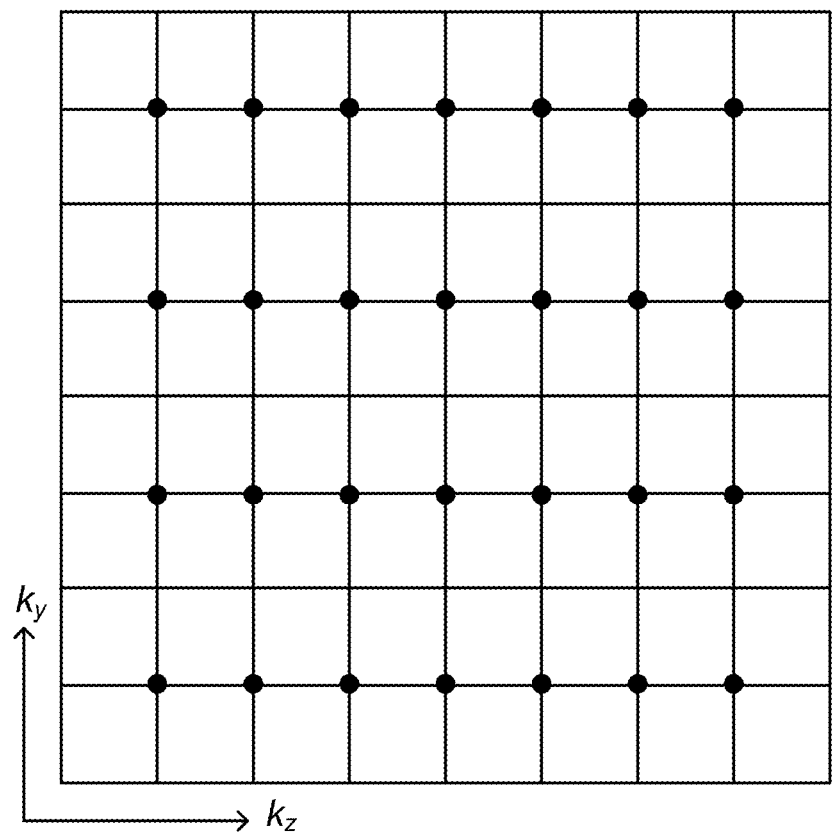
FIG. 3D shows a sampling pattern that is accelerated in the $k_y$ direction (i.e., $R_y=2$ and $R_z=1$), according to one implementation.
Figure 3E:
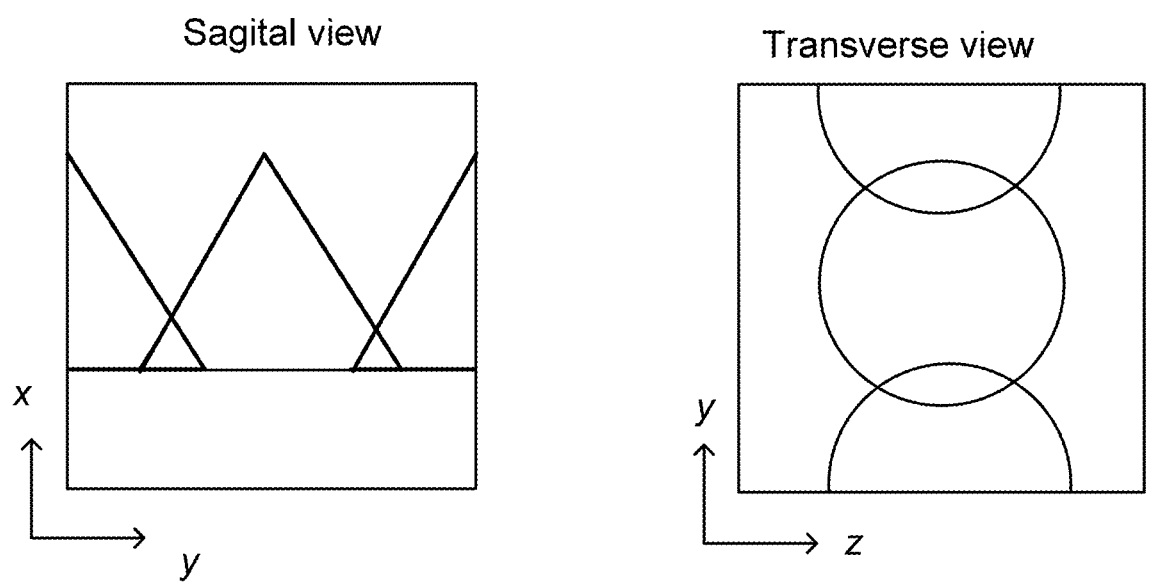
FIG. 3E shows sagittal and transverse views generated when Fourier transforming the MRI data acquired according to the sampling pattern in FIG. 3D, according to one implementation.

FIG. 3D illustrates sampling using an acceleration factor $R_y=2$ and $R_z=1$. That is, every other row is skipped in the $k_y$ direction. By zero-padding for the skipped samples and then taking a Fourier transform, the sagittal and transverse images shown in FIG. 3C will be generated. There is no aliasing in the z-direction, but there is aliasing in the y-direction.

Figure 3F:
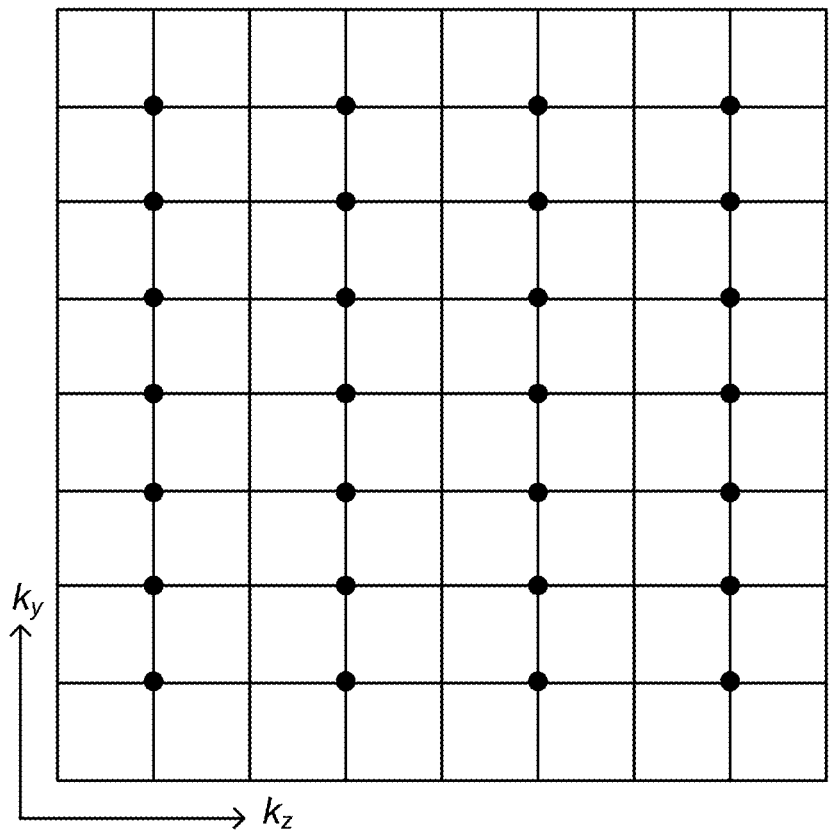
FIG. 3F shows a sampling pattern that is accelerated in the $k_z$ direction (i.e., $R_y=1$ and $R_z=2$), according to one implementation.

FIG. 3F illustrates sampling using an acceleration factor $R_y=1$ and $R_z=2$. That is, every other row is skipped in the $k_z$ direction. By zero-padding for the skipped samples and then taking a Fourier transform, the sagittal and transverse images shown in FIG. 3G will be generated. There is no aliasing in the y-direction, but there is aliasing in the z-direction.

FIG. 3H illustrates sampling using a CAIPI pattern for which the total acceleration factor is R=4. By zero-padding for the skipped samples and then taking a Fourier transform, the sagittal and transverse images shown in FIG. 3I will be generated. The aliased image is shifted in both the y-direction and the z-direction, resulting in the greatest separation between the primary image and the aliased image. This is advantageous for being able to separate the images. Further, for the aliased image the coil sensitivity is shifted by a greater amount than in either of the cases illustrated in FIGS. 3E and 3G. Accordingly, using the CAIPI pattern with SENSE processing produces better separation than does performing SENSE processing using either of the patterns in FIGS. 3D and 3F.

Figure 3G:
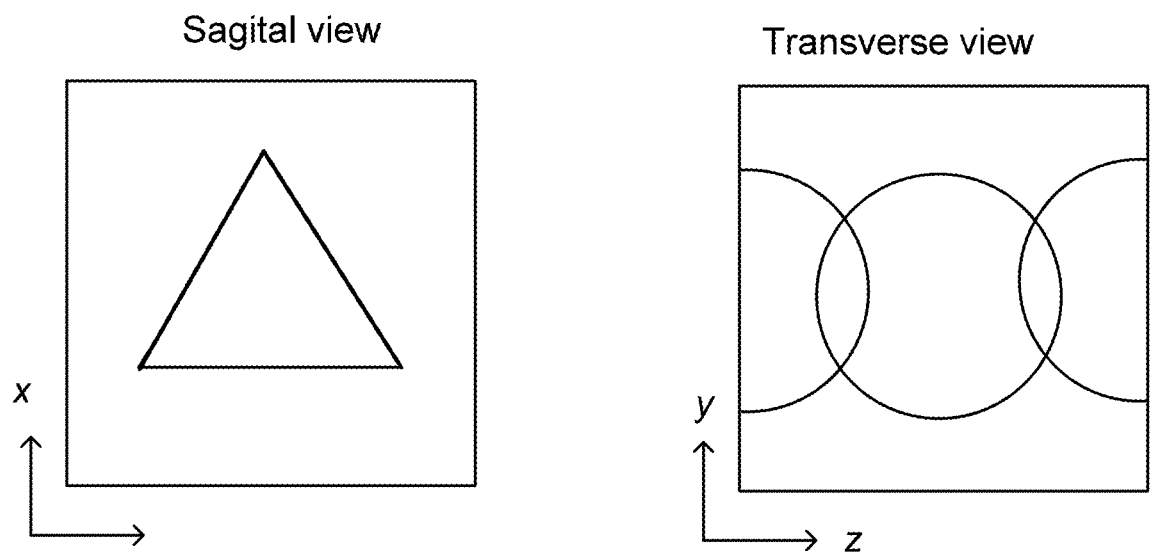
FIG. 3G shows sagittal and transverse views generated when Fourier transforming the MRI data acquired according to the sampling pattern in FIG. 3F, according to one implementation.
Figure 3J:
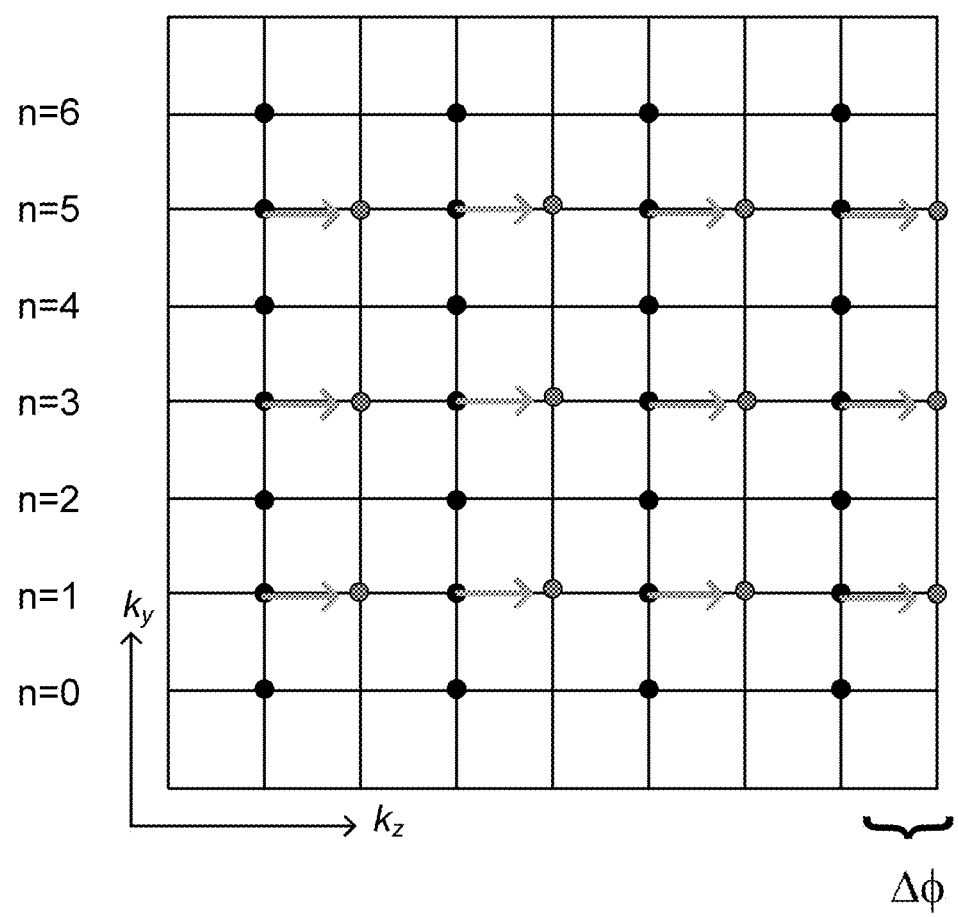
FIG. 3J shows a process of generating the CAIPI sampling pattern in FIG. 3H from the sampling pattern in FIG. 3F by adding a moment in the slice encode direction ($k_z$) $\Delta k_z$ to every other repetition time (TR), according to one implementation.

The CAIPI sampling pattern can be achieved, e.g., by starting with the pattern from FIG. 3F, and then, for every other sample point inducing an addition $\Delta\phi$ phase in the $k_z$ direction, as shown in FIG. 3J. For example, if the FE sequence shown in FIG. 4A provides the sampling pattern from FIG. 3F. Then, a time shift of $\Delta t$ can be added to each of the even RF excitation pulses to achieve the CAIPI sampling pattern.

The CAIPI sampling pattern shown in FIG. 3H is one of many CAIPI sampling pattern. For example, other CAIPI sampling pattern can be used for R=3, 4, 5, . . . , 16, . . . , as would be understood by a person of ordinary skill in the art. For example, an initial field echo (FE) pulse sequence that has a non-CAIPI sampling pattern can be calculated with an acceleration factor of $R_z=R$ in the $k_z$ direction. For the case R=2, initial FE pulse sequence is shown in FIGS. 3F and 3J. Then the CAIPI sampling pattern can be generated from the initial FE pulse sequence by modifying the relative timing of the RF pulse with respect to the $G_{SS}$ waveform for sample points along the $k_y$ direction for an initial value of $k_z$, as shown in FIG. 3J. These relative time shifts are calculated to applying to respective sampling points of the non-CAIPI sampling pattern a phase offset of $\Delta\phi=\theta+\text{mod}(m(n-1)2\pi/R, 2\pi)$, wherein mod(x,y) is the modulus operation of x with respect to y, $\theta$ can be any arbitrary phase so long as the same phase is applied to all of the sampling points, m is an integer selected from the set $\{1, \ldots, R-1\}$, and n is an index of the sampling point in the $k_y$ direction. For example, FIG. 3J shows the case in which R=2, m=1, and $\theta=0$, resulting in every other row in the $k_y$ direction being shifted in the $k_z$ direction by $\Delta\phi=\pi$ for odd values of n and by $\Delta\phi=0$ for even values of n.

These other CAIPI sampling patterns can be generated using the relative timing between RF excitation pulse and the $G_{SS}$ gradient waveform to shift a sample location along the $k_z$ (SE) direction. These shifts can be in either direction (e.g., positive or negative) along the $k_z$ S direction, and the time shift between the RF excitation pulse and the $G_{SS}$ gradient waveform can be in either direction (i.e., positive or negative). The flat-top portion of the $G_{SS}$ gradient waveform can extend sufficiently far in the positive and negative directions to accommodate either the positive or negative time shift. That is, a positive time shift might be more desirable than a negative time shift if the flat-top portion of the $G_{SS}$ gradient waveform extends farther in the positive time direction than the negative time direction, relative to the zero time.

In contrast to the method described herein, related methods generate displacements in the $k_z$ direction by phase modulating the RF pulses or by amplitude modulating the gradient fields. Unlike these related methods, the methods described herein realize the $k_z$ displacements through relative time shifts between the RF pulse and the $G_{SS}$ gradient magnetic field pulse.

In step 30 of method 50, the pulse sequence 325, which is determined in step 10 and then incorporates time shifts in step 20, is used to acquire MRI data 35.

In step 40 of method 50, MRI images are reconstructed from the MRI data 35 using techniques such as the SENSE method and the GRAPPA method, using CAIPI. Even when a non-CAIPI sampling pattern, such as in FIG. 3F, is used some displacement exists between the primary and aliased images, as shown in FIG. 3G. Thus, unaliasing of the images can be performed using parallel imaging techniques (e.g., SENSE and GRAPPA). When a CAIPI sampling pattern is used, however, to acquire the MRI data 35 the displacement between the primary and aliased images increases, as shown in FIG. 3I, improving the unaliasing of the images performed using parallel imaging techniques. That is the shift in the $k_z$ direction to realize a CAIPI sampling pattern minimizes alias overlap, which reduces the g-factor penalty by utilizing the in-plane coil sensitivity variations. In SENSE, the receiver coil (Rx) sensitivity spatial profile (referred to as an Rx map) is used to resolve the individual slice images.

Figure 5:
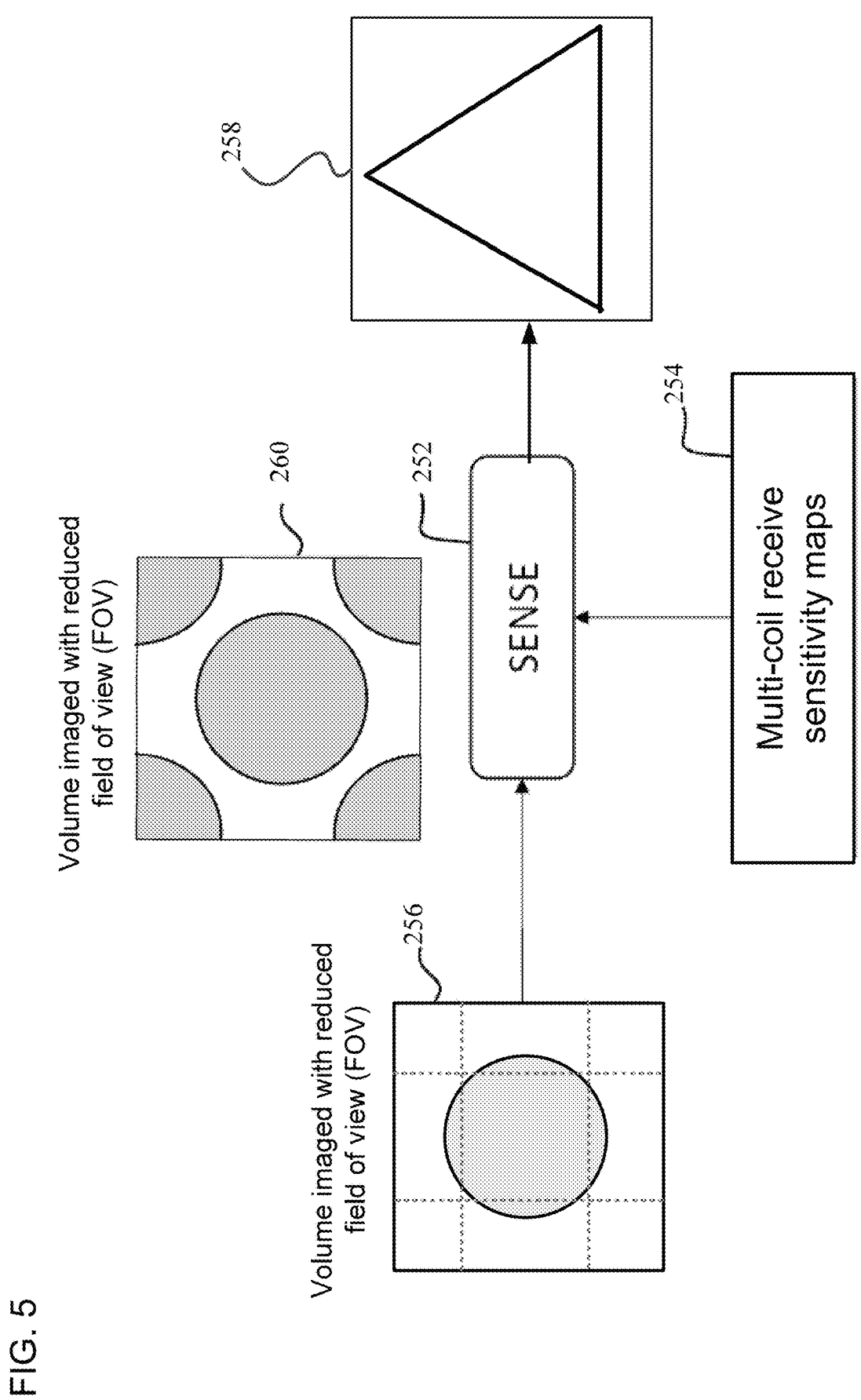
FIG. 5 shows MRI data acquired with a reduced field of view (FOV) and CAIPI techniques, and using a sensitivity encoding (SENSE) method to unalias the reconstructed image, according to one implementation.

FIG. 5 illustrates an extension of the techniques described above in relation to CAIPI imaging. In FIG. 5, a volume is imaged with a reduced FOV (field of view) and CAIPI sampling pattern to produce a shifted alias image 256.

Consider an in-plane accelerated imaging image 260 acquired with 2× acceleration. For an acceleration factor of 2, k-space lines are acquired at twice the step size of k-space for a full FOV acquisition, resulting in a ½-FOV image 260 being acquired from each coil. The ½-FOV image contains aliasing which includes a portion of the outer part of the triangle that is wrapped around, or aliased, onto the middle region of the triangle. If the SENSE reconstruction can use the coils sensitivity and an aliased coil sensitivity as two separate coils to separate the image and the alias of the image. Thus, an unaliased image 258 can be generated.

In some embodiments, the SENSE reconstruction processing 252 processing logic may be the same as the SENSE reconstruction logic in reconstruction module 202. The coil sensitivity maps 254 provided as input to the SENSE module 252, include at least multi-coil receive sensitivity maps.

In certain implementations, the magnitude of the time shift will be approximately the inverse of the bandwidth of the RF pulse, when the magnitude of the $G_{SS}$ magnetic field is equal to the ratio of the bandwidth of the RF pulse and the thickness of the FOV in the slice dimension ($FOV_Z$), $FOV_Z$ is approximately equal to the product of the slice thickness and number of slices, the spatial moment shift is the inverse of the $FOV_Z$, and the time shift is the ratio of the spatial moment shift to the magnitude of the $G_{SS}$ magnetic field.

In certain implementations, the FE sequence can include two phase-encode directions (y and z) in spatial shifts in both spatial dimensions corresponding to the phase-encode directions can be provided by patterns for respective moment shifts in both of the phase-encode directions in k-space ($k_y$ and $k_z$), as would be understood by a person of ordinary skill in the art.

To generate a given k-space moment shift for a particular repetition of data sampling, a time shift is used between the $G_{SS}$ magnetic field pulse and the RF pulse. A resulting k-space moment shift is proportional to the product between the time shift and the magnitude of the $G_{SS}$ magnetic field. This time shift can be induced either by keeping the time of the RF pulse constant and shifting the time of the $G_{SS}$ magnetic field pulse, or by keeping shifting the time of the RF pulse and keeping the time of the $G_{SS}$ magnetic field pulse constant. A third alternative is to partially shift both the RF pulse and partially shift the $G_{SS}$ magnetic field pulse such that the relative time difference between the two provides the desired time shift.

Regarding whether the RF pulse time shift might adversely affect image quality and chemical species separation, it is noted that for a FE sequence such as Volumetric Interpolated Breath-hold Examination (VIBE) the time shift is approximately 70 microseconds, which is 3% of the TE corresponding to a 10° of the water-fat separation. Thus, the effects from the time shift are small, resulting to a negligible effect to the image quality.

In the preferred embodiment, the $G_{SS}$ waveform is time shifted and the RF pulse timing is held constant. This embodiment avoids shifting the TE as described in the paragraph above. It also avoids change in TR from repetition to repetition, thus maintaining consistent sequence timing.

Additionally, the readout and phase encode gradients can remain fixed, the $G_{SS}$ waveform can retain the same amplitude and wave shape, the $G_{SS}$ waveform can be time-shifted, and the extra SS moment at each echo can cause a slice-position-dependent shift in the slice-encode (SE) direction, as described in U.S. patent application Ser. No. 15/791,898, which is incorporated by reference in its entirety.

In certain implementations, a "flat top" duration on the $G_{SS}$ waveform can be extended beyond the minimum duration allowable, thereby allowing $G_{SS}$ to shift without affecting RF selection. The flat top is the region of uniform amplitude in the middle of the slice-selection gradient waveform where RF pulse is typically executed.

In certain implementations, the image can be reconstructed using parallel imaging techniques (e.g., SENSE, GRAPPA, etc.), as discussed in Deshmane A, et al., "Parallel MR imaging," J Magn Reson Imaging, vol. 36, pp. 55-72 (2012) and in Breuer F A, et al., "Controlled aliasing in parallel imaging results in higher acceleration (CAIPIR-INHA) for multi-slice imaging," Magn Reson Med, vol. 53, pp. 684-691 (2005), which are both incorporated herein by reference in their entirety.

At high acceleration factors, parallel imaging methods can suffer SNR loss due to coil-geometry constraints. This reduction in SNR due to coil geometry is called the geometry-factor penalty or more commonly as the g-factor penalty. The g-factor can be thought of as a noise-amplification factor. For a given receive coil setup, higher noise can be expected in regions of the reconstructed image with high g-factor map values.

To better understand how the CAIPI technique improves the g-factor, it is helpful to consider that aliases can overlap each other. When there is not sufficient variation in receive coil sensitivity along the undersampled dimension, it can become challenging to separate the signals from different aliases. Thus, the SNR of the reconstructed slice images will be low due to the increased g-factor penalty. The SNR can be improved by shifting the aliases with respect to each other in the PE and SE directions at the time of acquisition using a method such as the CAIPI technique. The CAIPI technique exploits the variation of sensitivity in conventional receive coils. The $k_z$ shift causes voxels in one slice to alias with voxels in one or more other slices that have sufficiently orthogonal receive sensitivity values. This reduces the relatively high g-factor penalty associated with separating closely spaced or overlapping aliases, as discussed in U.S. Pat. No. 7,002,344, which is incorporated herein by reference in its entirety.

While certain implementations have been described, these implementations have been presented by way of example only, and are not intended to limit the teachings of this disclosure. Indeed, the novel methods, apparatuses and systems described herein may be embodied in a variety of other forms; furthermore, various omissions, substitutions and changes in the form of the methods, apparatuses and systems described herein may be made without departing from the spirit of this disclosure.

The invention claimed is:

1. An apparatus, comprising:
processing circuitry configured to
generate a field echo (FE) pulse sequence that acquires magnetic resonance imaging (MRI) data, the FE pulse sequence comprising a time series of radio-frequency (RF) pulses each occurring within a flat-top portion of slice-selection (SS) waveform of a SS gradient magnetic field, wherein the FE pulse sequence provides a controlled aliasing in parallel imaging (CAIPI) sampling pattern in k-space by, for each repetition time (TR) of the FE pulse sequence, providing a relative time shift between a center of the RF pulse and a center of the SS waveforms within each repetition time to generate respective spatial moment offsets in a slice-encode (SE) direction,
acquire MRI data using the FE pulse sequence, which has the CAIPI sampling pattern, and
reconstruct an MRI image from the MRI data.

2. A method, comprising:
generating a field echo (FE) pulse sequence that acquires magnetic resonance imaging (MRI) data, the FE pulse sequence comprising a time series of radio-frequency (RF) pulses each occurring within a flat-top portion of slice-selection (SS) waveform of a SS gradient magnetic field, wherein the FE pulse sequence provides a controlled aliasing in parallel imaging (CAIPI) sampling pattern in k-space by, for each repetition time (TR) of the FE pulse sequence, providing a relative time shift between a center of the RF pulse and a center of the SS waveforms within each repetition time to generate respective spatial moment offsets in a slice-encode (SE) direction;
acquiring MRI data using the FE pulse sequence, which has the CAIPI sampling pattern; and
reconstructing an MRI image from the MRI data.

3. The apparatus according to claim 1, wherein the processing circuitry is further configured to
generate the FE pulse sequence, wherein the RF pulses excite a transverse magnetization of spins within a field of view in an SS direction, and
reconstruct the MM image using a spatial offset between an aliased image and a primary image to unalias the MRI image, the spatial offset being determined by the CAIPI sampling pattern.

4. The apparatus according to claim 1, wherein the processing circuitry is further configured to reconstruct the MRI image using a sensitivity encoding (SENSE) method or a generalized autocalibrating partial parallel acquisition (GRAPPA) method.

5. The apparatus according to claim 1, wherein the processing circuitry is further configured to generate the FE pulse sequence by maintaining within each TR period a constant time for the center of the SS waveform while shifting times of the respective centers of the RF pulses within the TR period.

6. The apparatus according to claim 1, wherein the processing circuitry is further configured to generate the FE pulse sequence, the FE pulse sequence further comprising readout wavefomis of a readout gradient magnetic field, a first PE waveform of a first PE gradient magnetic field corresponding to the PE direction, and a second PE waveform of a second PE gradient magnetic field corresponding to another PE direction.

7. The apparatus according to claim 6, wherein the processing circuitry is further configured to generate the FE pulse sequence, wherein, for each TR period of the FE pulse sequence, the readout waveform is shifted in time within the TR period by a same amount as the center of the RF.

8. The apparatus according to claim 6, wherein the processing circuitry is further configured to generate the FE pulse sequence, wherein, for each TR period of the FE pulse sequence, the relative time shift is applied to the SS waveform and the center of the RF pulse is maintained constant within the TR period.

9. The apparatus according to claim 1, wherein the processing circuitry is further configured to generate the FE pulse sequence in which, for each TR period of the FE pulse sequence, an amount of the relative time shift is based on a ratio between (1) a spatial moment shift and (2) a magnitude of the SS gradient magnetic field during the flat-top portion of SS waveform.

10. The apparatus according to claim 6, wherein the processing circuitry is further configured to generate the FE pulse sequence to have an acceleration factor of R in the PE direction by obtaining an initial FE pulse sequence that has a non-CAIPI sampling pattern with an acceleration factor of R in the SE direction, and applying to respective sampling points of the non-CAIPI sampling pattern a spatial moment offset of $\Delta k_z = m/FOV_z$, where m is an integer selected from the set $\{0,1,2, \ldots ,R-1\}$.

11. The apparatus according to claim 6, wherein the processing circuitry is further configured to generate the FE pulse sequence to have an acceleration factor of R in the PE direction, and, for every $R^{th}+m$ sample point in the other PE direction, the phase offset is zero and the relative time shift is zero, wherein m is an integer selected from the set $\{1,2, \ldots ,R-1\}$.

12. The apparatus according to claim 1, further comprising

RF transmitters configured to generate the first RF pulse and the second RF,

RF coils configured to receive field echoes to generate the MRI data, and an SS gradient magnetic field coil to generate the SS gradient magnetic field.

13. The method according to claim 2, wherein generating the FE pulse sequence further comprises that the RF pulses excite a transverse magnetization of spins within a field of view in an SS direction, and reconstructing the MRI image further comprises using a spatial offset between an aliased image and a primary image to unalias the MRI image, the spatial offset being determined by the CAIPI sampling pattern.

14. The method according to claim 2, wherein reconstructing the MRI image further comprises using a sensitivity encoding (SENSE) method or a generalized autocalibrating partial parallel acquisition (GRAPPA) method.

15. The method according to claim 2, wherein generating the FE pulse sequence further comprises maintaining within each TR period a constant time for the center of the SS waveform while shifting times of the respective centers of the RF pulses within the TR period.

16. The apparatus according to claim 2, wherein generating the FE pulse sequence further comprises that the FE pulse sequence further comprising readout waveforms of a readout gradient magnetic field, a first PE waveform of a first PE gradient magnetic field corresponding to the PE direction, and a second PE waveform of a second PE gradient magnetic field corresponding to another PE direction.

17. The method according to claim 16, wherein generating the FE pulse sequence further comprises that, for each TR period of the FE pulse sequence, the readout waveform is shifted in time within the TR period by a same amount as the center of the RF.

18. The method according to claim 16, wherein generating the FE pulse sequence, further comprises that for each TR period of the FE pulse sequence, the relative time shift is applied to the SS waveform and the center of the RF pulse is maintained constant within the TR period.

19. The method according to claim 2, wherein generating the FE pulse sequence further comprises that, for each TR period of the FE pulse sequence, an amount of the relative time shift is based on a ratio between (1) a spatial moment shift and (2) a magnitude of the SS gradient magnetic field during the flat-top portion of SS waveform.

20. The method according to claim 16, wherein generating the FE pulse sequence further comprises that an acceleration factor in the PE direction is R, and the FE pulse sequence by obtaining an initial FE pulse sequence that has a non-CAIPI sampling pattern with an acceleration factor of R in the SE direction, and applying to respective sampling points of the non-CAIPI sampling pattern a spatial moment offset of $\Delta k_z = m/FOV_z$, where in is an integer selected from the set $\{0,1,2, \ldots ,R-1\}$.

* * * * *